United States Patent [19]

Sakamoto et al.

[11] Patent Number: 4,954,717
[45] Date of Patent: Sep. 4, 1990

[54] PHOTOELECTRON MASK AND PHOTO CATHODE IMAGE PROJECTION METHOD USING THE SAME

[75] Inventors: Kiichi Sakamoto, Tokyo; Hiroshi Yasuda, Yokohama; Akio Yamada; Jinko Kudou, both of Kawasaki, all of Japan

[73] Assignee: Fujitsu Limited, Kawasaki, Japan

[21] Appl. No.: 283,982

[22] Filed: Dec. 13, 1988

[30] Foreign Application Priority Data

Dec. 15, 1987 [JP] Japan .................. 62-316901

[51] Int. Cl.$^5$ ............................ H01J 40/06
[52] U.S. Cl. ............................... 250/492.3
[58] Field of Search ............... 250/492.2, 492.24

[56] References Cited

U.S. PATENT DOCUMENTS

| 3,588,570 | 6/1971 | O'Keeffe . | |
| 3,843,916 | 10/1974 | Trotel et al. | 250/492.24 |
| 3,867,148 | 2/1975 | O'Keefe et al. | 430/313 |
| 3,895,234 | 7/1975 | O'Keefe et al. | 250/492.2 X |
| 4,137,458 | 1/1979 | King et al. | 250/492.24 |
| 4,514,489 | 4/1985 | Garcia et al. | 430/311 |
| 4,528,452 | 7/1985 | Livesay | 250/492.24 |

FOREIGN PATENT DOCUMENTS 0157457 10/1985 European Pat. Off. .
0182665 5/1986 European Pat. Off. .

OTHER PUBLICATIONS

IEEE Transactions on Electron Devices, vol. ED-22, No. 7, Jul. 1975, "An Electron Image Projector with Automatic Alignment", by Julian P. Scott, pp. 409-413.
IBM Technical Disclosure Bulletin, vol. 25, No. 3A, Aug. 1982, "Proximity Correction in E-Beam Systems", by N. G. Anantha et al., p. 986.

Primary Examiner—Bruce C. Anderson
Attorney, Agent, or Firm—Staas & Halsey

[57] ABSTRACT

A photoelectron mask for photo cathode image projection includes a transparent substrate, and a pattern formed on a main surface of the transparent substrate. The pattern includes a non-transparent material. The mask also includes a photoelectron emission film formed so as to cover the main surface of the transparent substrate on which the pattern is formed. The photoelectron emission film includes a material selected from the group consisting of pure platinum, a platinum-rich material containing platinum as the major component, and a platinum compound.

15 Claims, 10 Drawing Sheets

PHOTOELECTRON MASK AND PHOTO CATHODE IMAGE PROJECTION METHOD USING THE SAME

BACKGROUND OF THE INVENTION

The present invention generally relates to a photoelectron mask for photo cathode image projection and a photo cathode image projection method using the same. More particularly the present invention is directed to the development of photo cathode materials, and a photo cathode image projection method which uses photoelectron masks in which the developed photo cathode materials are used.

As a fine pattern technique of producing a semiconductor integrated circuit such as a very large scale integrated circuit (VLSI), there is an exposure technique in which a fine pattern is exposed on a wafer. An ultraviolet-ray exposure method is used as lithography technology for a long time. However, there is a limit on the width of a fine pattern because a wavelength of light which can be used in the ultraviolet-ray exposure method is limited to approximately 4000 Å. Therefore, active research is being made on new exposure techniques as electron beam lithography, X-ray lithography, and photo cathode image projection lithography.

In electron beam lithography, an electron beam shaped into a spot or an electron beam having a rectangular cross section is deflected and irradiated on a wafer mounted on a stage, which is moved during irradiation. Therefore, electron beam lithography needs a column system for focusing, shaping and deflecting the electron beam emitted from an electron source, a stage system for supporting the wafer and changing the pattern image transferred position thereon, and a control system for controlling the column system and the stage system. Electron beam lithography is capable of providing high resolution. However a pattern is drawn with a single stroke of the electron beam based on enormous pattern data. For this reason, exposure of the wafer take a long time. Additionally, throughput which is defined as the number of wafers that can be exposed per hour, is low. It follows that electron beam lithography is not suitable for mass production of wafers.

X-ray lithography is proximity printing in which there is used a large-scale X-ray source having a power of 10 to 50 kW and an X-ray beam having a wavelength of 1 to 10 Å. Therefore, in addition to the above-mentioned X-ray source, the X-ray exposure method needs a mask, and an aligner which can support the wafer and position the wafer and mask with a high positioning accuracy. From this viewpoint, the X-ray exposure method is similar to a conventional photoexposure process. However, the X-ray exposure method has the following disadvantages. First, a large-scale X-ray source is required. Second a material used for fabricating a mask must be carefully noted in view of the relationship between the wavelength of the X-ray source and the X-ray absorption rate. Third, an increased diameter of the wafer may cause deformation such as warpage and bending in the mask. As a result, a gap deformation, and a fine X-ray image cannot be formed on the wafer. Fourth, it is difficult to obtain a strong X-ray intensity, and throughput is poor. Synchrotron radiation is proposed as the X-ray source. However, the use of synchrotron radiation increases the size of an apparatus, and is therefore very expensive. Thus the use of the synchrotron radiation is not suitable for practical use.

Recently, there has been considerable activity in the research and development of photo cathode image projection. The photo cathode image projection method can provide high throughput and high resolution. Two different types of photo cathode image projection are known. In the first type of photo cathode image projection, a metal-insulator-semiconductor structure is used as a mask. Light is projected onto a semiconductor layer which then produces photoelectrons. The produced photoelectrons pass through an insulator such as a silicon dioxide layer. Then the photoelectrons pass through a metal film such as a silver film, and are emitted. It is noted that in the first type of photo cathode image projection, the metal film itself does not produce electrons. As described above, electrons are produced in the semiconductor layer.

On the other hand, the second type of photo cathode image projection uses a mask in which a photo cathode material is used. When light having a work function higher than a potential barrier of a photo cathode material is projected thereon, the photo cathode material produces photoelectrons. Generally, a pattern of a non-transparent material is formed on a transparent substrate. A film made of a photo cathode material is formed so as to cover the pattern. Light is projected onto a rear source of the substrate opposite to the surface on which the pattern is formed. Photoelectrons are emitted from portions of the photo cathode material film which do not overlie the pattern. The emitted photoelectrons are accelerated and focused on the wafer by the function of the magnetic and electric fields. Then the pattern image is exposed on the wafer. The present invention is concerned with the second type of photo cathode image projection.

It is desired that photo cathode materials be capable of stably emitting strong photoelectrons for a long time. In addition, it is desired that there exists a material capable of providing large contrast to photo cathode materials. Moreover, it is desired that photo cathode materials are stable in the air, and are easily handled to form a mask.

Conventionally, hydroiodic cesium (CsI) is proposed as a photo cathode material. A photo cathode is formed by depositing hydroiodic cesium on the entire surface of the substrate by evaporation under vacuum. However, hydroiodic cesium has a disadvantage in which energy at the basic absorption end of light is high. This means that the work function of hydroiodic cesium is high. The work function is defined as the height of the potential barrier. Photoelectrons excited by the projection of light must go over the potential barrier so that electrons are emitted from the hydroiodic cesium. Additionally, hydroiodic cesium absorbs water with ease and is therefore unstable. As a result, the pattern formed on the substrate is quickly damage. In practical use, the exposure can be repetitively carried out only 20 to 50 times.

Galium arsenic is also proposed as one of photo cathode materials. In practical use, a cesium thin-film is often formed on a galium arsenic film. The cesium thin-film functions to decrease the work function. Therefore, the above film structure can provide high quantum efficiency. However, there is a problem in which foreign materials are easily deposited on the cesium thin-film and thus, the life time of the mask is very short.

Silver oxide is also proposed as one of photo cathode materials. Silver oxide has a high quantum efficiency.

However, it has a disadvantage in which there is no material capable of providing good contrast with respect to silver oxide.

The present inventors have proposed cesium-added silver as a photo cathode material in U.S. Pat. application Ser. No. 086,510. In the proposal, a cesium film is formed on a patterned silver film under vacuum. Cesium may be substituted with other alkaline metals or alkaline-earth metals. Silver used together with cesium is more stable than hydroiodic cesium and has the lifetime longer than that of hydroiodic cesium. However, cesium is liable to leave the silver film due to the projection of light. A decrease of cesium on the silver film decreases the amount of photoelectrons emitted from the silver pattern. Therefore, it is necessary to frequently activate the mask.

The following document proposes to use palladium as a photo cathode material: An-Electron-Image Projector With Automatic Alignment J. P. Scott., IEEE Trans. on Electron Devices, ED-22 409-413, 1975. The above document indicates that hydroiodic cesium is better than palladium from various viewpoints.

It can be seen from the above description that with conventional materials, it is impossible to satisfy all the factors desired from photo cathode materials. It is particularly noted that the aforementioned various problems arise from the presence of alkaline metals or alkaline-earth metals.

SUMMARY OF THE INVENTION

It is a general object of the present invention to provide a novel and useful photoelectron mask for photo cathode image projection.

A more specific object of the present invention is to provide a photoelectron mask which does not use alkaline metals and alkaline-earth metals.

Another object of the present invention is to provide a photoelectron mask capable of stably emitting photoelectrons having strong power over a long time.

Yet another object of the present invention is to provide a photoelectron mask which is stable in air and is easily produced.

The above objects of the present invention can be achieved by a photoelectron mask including a transparent substrate, a pattern formed on a main surface of the transparent substrate, the pattern comprising a non-transparent material and a photo cathode film formed so as to cover the main surface of the transparent substrate on which patterns are to be formed. The photo cathode film comprises a material selected from the group consisting of pure platinum, a platinum-rich material containing platinum as the major component, and a platinum compound.

The aforementioned objects of the present invention can be also achieved by a photoelectron mask for photo cathode image projection comprising a substrate, and a pattern formed on a main surface of the transparent substrate. The pattern comprises a photo cathode material selected from the group consisting of pure platinum, a platinum-rich material containing platinum as the major component, and a platinum compound.

A further object of the present invention is to provide a photo cathode image projection method using the above mask.

The above object of the present invention can be achieved by a photo cathode image projection method including the steps of projecting an excitation light onto a photoelectron mask placed in a vacuum chamber to thereby excite photoelectrons, the photoelectron mask comprising a photo cathode material selected from the group consisting of pure platinum, a platinum-rich material containing platinum as the major component, and a platinum compound, and projecting the photoelectrons from the photoelectron mask onto a wafer placed in the vacuum chamber by focusing the photoelectron emitted from the photo cathode material due to a function of a magnetic field and an electric field, so that a pattern is formed on the wafer by the projection of the photoelectrons.

Other objects, features and advantages of the present invention will become apparent from the following detailed description when read in conjunction with the accompanying drawings.

DESCRIPTION OF THE PREFERRED EMBODIMENTS

Figure 1:
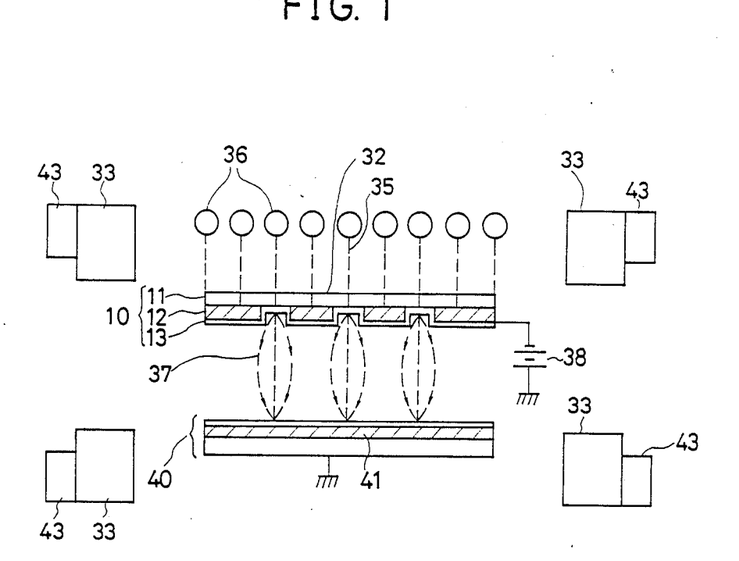
FIG. 1 is a diagram of showing the principle of a photo cathode image projection method according to the present invention.
Figure 2:
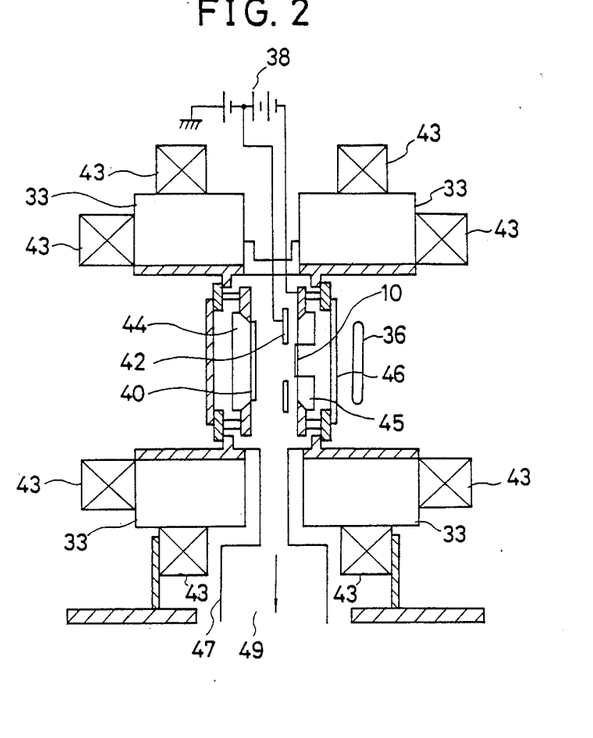
FIG. 2 is a diagram showing essential parts of a photo cathode image projection apparatus capable of implementing the photo cathode image projection method according to the present invention.

A description is given of a photo cathode image projection method which uses a mask and a method according to the present invention with reference to FIGS. 1, 2A and 2B.

Referring to FIG. 1, a photoelectron mask (hereinafter simply referred to as a mask) 10 and a wafer 40 are located in the parallel magnetic field formed by focusing coils (Helmholz coils) 33. The parallel magnetic field is directed downwards in the drawing. The mask 10 and the wafer 40 face each other in parallel and are positioned in parallel with the magnetic field. The mask 10 is made up of a transparent substrate 11, a metallic pattern 12 and a platinum film. 13. A detailed description will be given later. A film 41 made of an electron beam sensitive material is formed on the entire surface of the wafer 40. A negative potential is applied to the mask 10 and a positive potential is applied to the wafer 40.

A plurality of light sources 36 are arranged at the back of the mask 10. Light beams 35 emitted from the light sources 36 enter the substrate 11. The light beams 35 projected onto the metallic pattern 12 cannot pass through the mask 10. On the other hand, some light beams 35 projected onto portions of the platinum film 13 which are not covered with the metallic pattern 12, can pass through the mask 10. The portions of the platinum film 13 emit photoelectron beams 37 as shown. Light beams 37 emitted from a point on the platinum film 13 exhibit a spiral locus due to the functions of an acceleration voltage supplied by a power source 38 and the parallel magnetic field produced by the focusing coils 33. The light beams 37 emitted from the point are then focused at a point on the wafer 40.

FIG. 2 is a photo cathode image projection apparatus in which the photo cathode image projection method and the mask 10 are used. Referring to FIG. 2, an X-Y stage 45 for mounting the mask 10 thereon is arranged on the right side of the center of the figure. The mask 10 mounted on the X-Y stage 45 is opposite to the wafer 40 mounted on an X-Y stage 44 located on the left side of the center of the figure. Plate electrodes 42 connected to the power source 38 are located between the mask 10 and the wafer 40. A backscattered electron detector (not shown in FIG. 2) is provided on each plate electrode 42. The backscattered electron detector detects an electron beam generated at a time when electrons from an alignment mark (described in detail later) provided on the mask 10 hit a positioning mark (not shown) provided on the wafer 40. The relative position between the mask 10 and the wafer 40 is determined based on the detected electron beam. Deflection coils 43 are used when scanning the electron beam from the alignment mark on the mask 10 on the positioning mark on the wafer 40. The mask 10 mounted on the X-Y stage 45, the wafer mounted on the X-Y stage 44 and the plate electrodes 42 are accommodated in a chamber 47 having an output 49.

Figure 3:
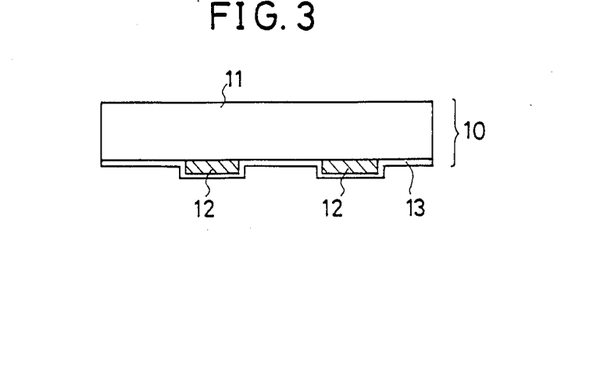
FIG. 3 is a cross sectional view of a photoelectron mask according to a first embodiment of the present invention.

A further description is given of the mask 10 with reference to FIG. 3. Referring to FIG. 3A, the mask 10 is made up of a transparent substrate 11, a metallic pattern 12 and a platinum film 13. The transparent substrate 11 is made of quartz, sapphire, ruby or the like. The metallic pattern 12 is formed by depositing a metallic film by evaporation or sputtering and then etching the metallic film. The metallic pattern 12 is made of chromium (Cr), tantalum (Ta), tungsten (W) or the like. In the photo cathode image projection method, the pattern image is exposed on the wafer as it is without reduction and enlargement of the image. From this viewpoint, the aforementioned electron beam exposure apparatus can be used in a photo cathode image projection. It is preferable to set the thickness of the metallic pattern 12 equal to 400 to between 2000 Å. The above range of the thickness of the metallic pattern 12 is enough to interrupt light therein. If the metallic pattern 12 has a thickness less than 400 Å, it is difficult to effectively interrupt light. Similarly, even if the metallic pattern 12 is set larger than 2000 Å in thickness, increased light absorption is not obtainable.

By evaporation or sputtering, the platinum film 13 is formed on the surface of the transparent substrate 11 on which the metallic pattern 12 is formed. It is preferable that film 13 between 10 to 300 Å thick. The thickness of the platinum film 13 is determined depending on the photoelectron yield and transmittance of ultra light.

Figure 4:
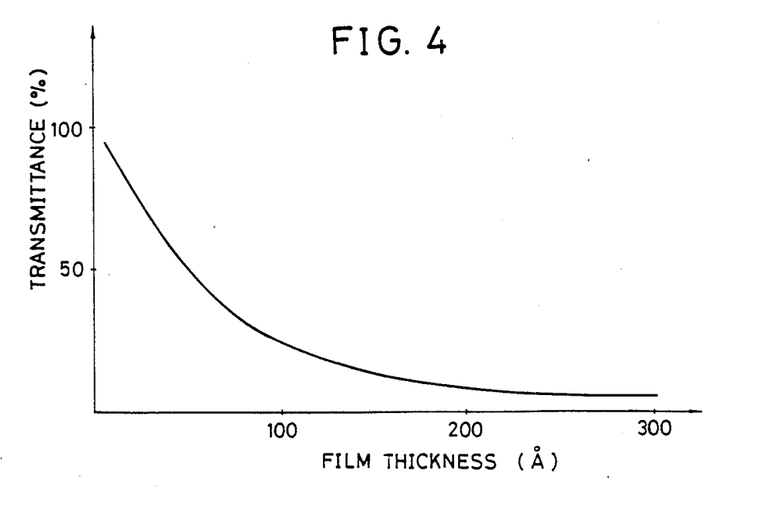
FIG. 4 is a graph of the relationship between the thickness of a platinum film and the transmittance.
Figure 5:
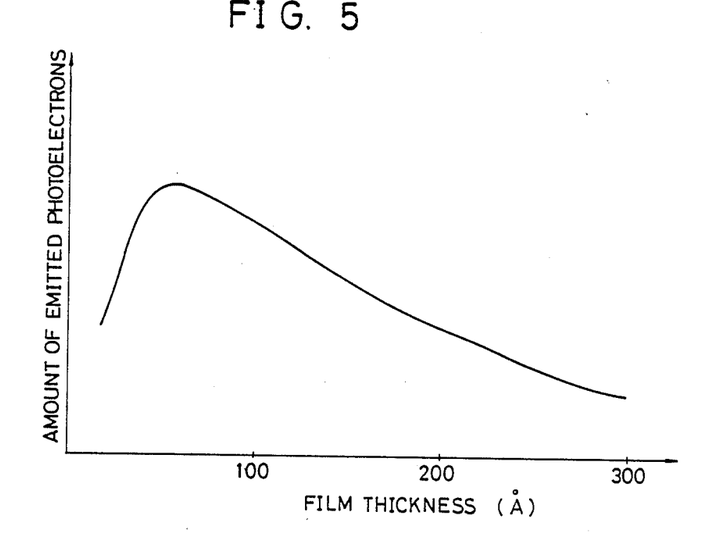
FIG. 5 is a graph of the relationship between the thickness of a platinum film and the photoelectron current.

FIG. 4 is a graph of the relationship between the thickness of the platinum film 13 and the transmittance of ultraviolet light having a wavelength of 250nm. FIG. 5 is a graph of the relationship between the thickness of the platinum film 13 and the amount of emitted photoelectron current (photoelectron yield). Generally, an electron beam sensitive resist is exposed even by an excitation light for use in emission of photoelectrons. For this reason, it is desirable that a platinum film passes less light therethrough. For this purpose, it is conceivable to make a platinum film thicker. However, it can be seen from the graph of FIG.5 that excessive thicknesses decrease the photoelectron current. From the above-mentioned viewpoints, a thickness of between 10 to 300 Å is usable, and the most suitable thickness range is between 40 to 150 Å.

Figure 6:
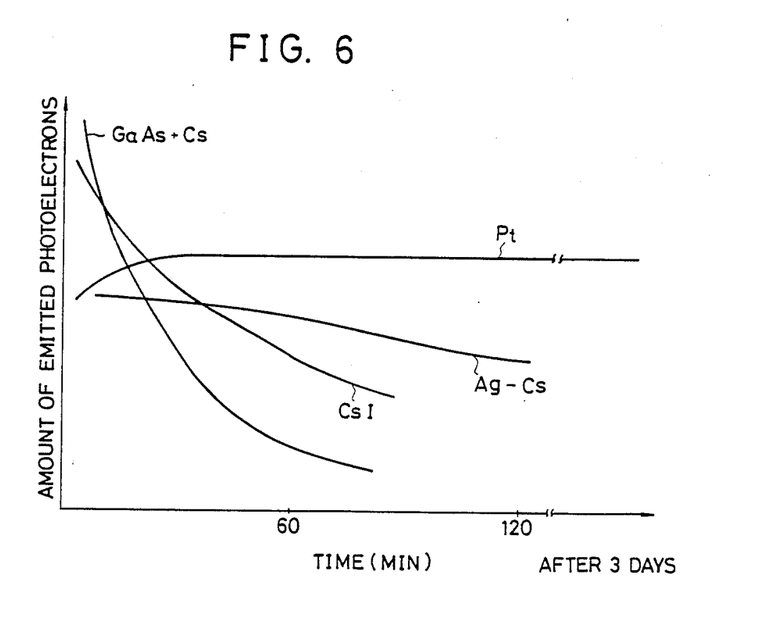
FIG. 6 is a graph of the photoelectron current for some photo cathode materials as a function of time.

FIG. 6 in a graph of the photoelectron current of platinum as a function of time. FIG. 6 also shows a curve of the photoelectron current of hydroiodic cesium, galium arsenic and cesium-added galium arsenic, which are materials used in conventional masks. As can be seen from FIG. 6, the photoelectron current with respect to hydroiodic cesium, galium arsenic and cesium-added galium arsenic has decreased considerably after about 120 minutes from the beginning of exposure. On the other hand, the graph of FIG. 6 exhibits that the photoelectron current of platinum hardly decreases even after 3 days from the beginning of exposure. A variation in the photoelectron current of platinum is within ±10%. It is clear that platinum is about 100 times more stable than other materials, and is capable of providing stable photoelectron current for several tens of hours.

The inventors measured the photoelectron emission current of a platinum film having a thickness of 50 Å. In the experiment, a 2kW Hg-Xe lamp was used as the light source. The inventors obtained photoelectrons having an emission current of 20 $\theta A/cm^2$. For the above value of the emission current, the quantum efficiency is approximately $2 \times 10^{-4}$ Normally, the exposure process using the above-mentioned platinum film is completed in one to four seconds. For example, about 40 shots for a 6" wafer are possible. Therefore, even if it takes 60 seconds per sheet for processes except for the exposure process, it takes 2 to 4 minutes per sheet for the exposure process. Therefore, it is possible to expose 15 to 30 wafers per hour. Consequently, according to the present invention, greatly increased throughput is obtainable, compared with the conventional lithography technique. If an excimer laser is used as the light source, throughput can be improved by two figures. As can be seen from the above description, a platinum film which satisfies the specific conditions particularly with respect to thickness and wavelength of the excitation light, is capable of high emission current yield rate.

A description is given of an activation process for the mask film 10. As described previously, the photoelectron current of the platinum film 13 has less decrease than even after 3 days from the beginning of the exposure process. However, foreign materials such as steam contained in the vacuum atmosphere, atoms and molecules contained in resists may adhere to the mask 10. The adhesion of such foreign materials causes a decrease in the photoelectron current. In order to avoid this problem, after a predetermined exposure time or exposure dose, it is preferable to activate the mask 10 by projecting light onto the mask 10 which is placed into a vacuum chamber or a load-lock chamber continuously provided with a gas of nitrogen ($N_2$), oxygen ($O_2$) or ozone ($O_3$), or a mixture gas consisting of any combination thereof.

When the mask 10 becomes heavily dirty, the mask 10 is taken out of the vacuum chamber, and is then exposed to a plasma in the above-mentioned gas or a hydrogen gas. By this activation process, the mask 10 can be completely cleaned up. Conventional photo cathode materials, particularly hydroiodic cesium are deliquescent materials. Therefore, hydroiodic cesium begins thawing soon after it is placed in air. For this reason, it is required to remove the hydroiodic cesium film from the mask during the cleaning process. On the other hand, platinum is one of the most stable metals. For example, palladium known as a photoelectron emission material greatly absorbs hydrogen and changes in nature. Platinum does not have such undesirable properties.

Figure 7:
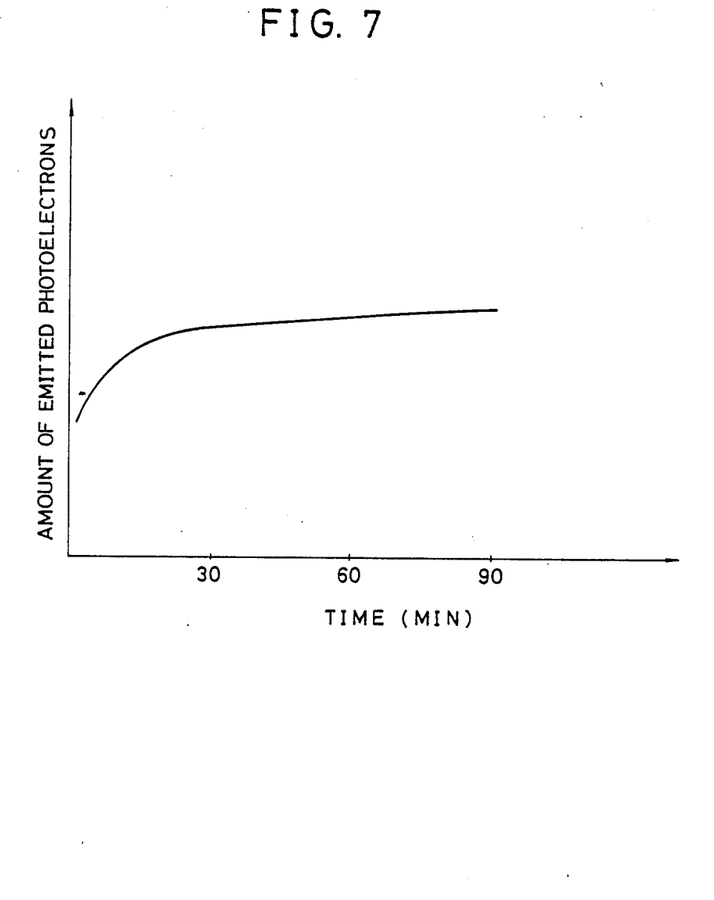
FIG. 7 is a graph of the photoelectron current for a platinum film as a function of time.

FIG. 7 is a graph experimental results showing the photoelectron emission current of a platinum film as a function of time. The experiment was conducted in an $N_2$ atmosphere. The graph of FIG. 7 shows that the platinum film can be almost recovered for 15 minutes after the activation process. It is noted that the time taken to recover the platinum film depends on the luminous intensity and the type of resist.

The platinum film 13 has good adhesion to the transparent substrate 11, because the platinum film 13 is very thin. Adhesion of the platinum film 13 can be enhanced by using a platinum-rich material. The following materials can be contained in platinum: silicon (Si), tungsten (W), nitrogen (N), titanium (Ti), chromium (Cr), aluminum (Al), palladium (Pd), gold (Au), silver (Ag), copper (Cu), oxygen (O), rhodium (Rh) and iridium (Ir). Materials containing platinum as the major component has transmittance almost identical to that for pure platinum. It is preferable to contain the above-mentioned material within 10 to 15 weight % in platinum. That is, a platinum-rich material is defined as a material containing platinum with 85 weight % or over. Hence, the film 13 made of a platinum-rich material is set equal to 10 to 300 Å in thickness. As is well known, a number of platinum compounds are available. Alternatively, the film 13 can also be made of platinum compounds such as platinum chloride ($PtCl_x$), platinum fluoride ($PtF_x$), platinum oxide ($PtO_y$), platinum selenium ($PtSe_x$), and barium platinum (BaPt) (x and y denote the content). Our experiments exhibited that platinum-rich films containing titanium have a photoelectron emission yield almost the same as that for pure platinum films. Further, it is confirmed by experiments that the contact properties are enhanced, and that as the platinum-rich film 13 gets thicker, the adhesion is further enhanced. Films made of platinum compounds exhibit similar advantageous effects.

A description is given of a photo cathode image projection method in which the aforementioned mask 10 is used. Basically, a sequence of the photo cathode image projection method of the present invention is similar to that of a conventional photo cathode image projection method. The present method has the following essential features. For sake of the understanding the present method, the essential features are now summarized as follows. In the following explanation, a case is described in which the photoelectron emission film such as film 13 is made of pure platinum.

A real exposure pattern on a mask is defined as an area consisting of a pattern made of a non-transparent material and a portion of a photoelectron emission film which is formed directly on a substrate. Further, in the vicinity of the real exposure pattern, there are arranged a plurality of alignment marks used for positioning the mask and wafer. Moreover, a unit of an exposed area (an exposed area unit) is defined as an area which consists of the real exposure pattern and related alignment marks. The mask comprises a plurality of the exposed area units).

It is desired that excitation light irradiated on the mask in order to emit photoelectrons therefrom has a wavelength between 220 to 300 nm.

Further enhanced throughput is desired, it is preferable to employ a light source capable of providing light having large luminous intensity. For this purpose, it is desirable to use an excimer laser, particularly a KrF excimer laser or an ArF excimer laser.

It is preferable that light to be irradiated on the alignment marks for use in positioning be the secondary harmonic wave of an Ar laser.

Pure platinum films, platinum-rich films or platinum compound films, may be made nonuniform in thickness resulting from an adhesive state. Additionally, foreign materials may adhere to the real exposure pattern. In this case, photoelectrons are not emitted from a portion of the real exposure pattern to which foreign materials adhere. As a result, images projected onto the wafer do not have uniform properties. The above-mentioned problems can be eliminated as follows. A plurality of exposed area units each having the same pattern on a single mask substrate are used. Each exposed area unit is subsequently positioned. Then the pattern is transferred to the surface of the wafer by using the positioned exposed area unit. In the above-mentioned repetitive exposure operation, the necessary exposure dose is supplied from the plurality of exposed area units. Thus, uniform transferred images are obtainable, even if there is a difference in photoelectron current between the exposed area units due to the presence of foreign materials which adhere to the real exposure pattern.

Normally, various patterns are exposed on a sheet of wafer. In order to facilitate the exposure of various patterns on the single wafer, it is preferable to form exposed area units having different real exposure patterns on a mask. By using the above mask, it becomes possible to form different patterns on the wafer without replacing the mask.

Foreign materials such as resist on the wafer, carbon and steam contained in the vacuum chamber may adhere to the mask. These foreign materials decrease the photoelectron emission yield. Such foreign materials can be removed from the mask by irradiating light onto the mask placed in the exposure vacuum chamber or the load-lock chamber arranged close to the exposure vacuum chamber which is provided with a gas of $N_2$, $O_2$ or $O_3$, or a mixture gas consisting of any combination thereof. It is particularly noted that platinum is extremely stable as a photo cathode material, and therefore photo-ashing is possible. Of course, plasma-ashing may be used.

The proximity effect is encountered even in photo cathode image projection. That is, electrons which enter a wafer are scattered therein by atoms or the like. This is called backscattering. The scattered electrons expose the electron beam sensitive resist coated on the wafer. As patterns to be exposed become close to each other, a portion between adjacent patterns which is not to be exposed is processed as that portion is actually exposed. The above phenomenon is called the proximity effect. This problem can be eliminated as follows. A first exposed area unit having a pattern to be projected onto the wafer is prepared. Additionally, a second exposed area unit having a pattern in which negative and positive areas of the first exposed area unit are reversed. In the exposure process, the pattern of the first exposed area unit is exposed on the wafer. Then the pattern of the second exposed area unit is exposed on the wafer. Further, the pattern of the first exposed area unit is exposed on the wafer in a state where the projection image of the first pattern on the wafer is somewhat out of focus, or a decreased exposure dose is selected. Alternatively, the proximity effect can be overcome as follows. A first exposed area unit is prepared in which the entire pattern to be exposed or a portion thereof is formed. A second exposed area unit is prepared in which only a portion of the exposure pattern in which an increased exposure dose is desired, is formed. After exposing the pattern of the first exposed area unit to light, the pattern of the second exposed area unit is exposed to light with a suitable exposure dose.

A more detailed description given of the photo cathode image projection according to the present invention. As described previously, excitation light having a wavelength between 220 to 300 Å is suitable for emitting photoelectrons from the platinum film 13 in FIG. 3. A light source capable of emitting the above excitation light is formed by a 2kW mercury-xenon lamp for use in the deep-UV range which is used together with a filter and a cold mirror. If it is not desired to obtain high throughput, a 500W mercury-xenon lamp may be used as the light source. By the use of the 500W lamp, a smaller amount of heat is applied to the mask.

In the case where hydroiodic cesium is used as the photoelectron emission material, a low-pressure mercury lamp is used. This is because the work function of hydroiodic cesium is high, and only light having a wavelength less than 200 nm enables photoelectrons to be emitted from hydroiodic cesium. At the same time, the low-pressure mercury lamp emits light having a wavelength of 248 nm which is not related to photoelectron emission. It is impossible to interrupt only the light having a wavelength of 248 nm. As a result, the electron beam sensitive resist is exposed to the light having a wavelength of 248 nm.

An excimer laser is suitable for obtaining an increased luminous intensity of the excitation light. Laser beams emitted from the excimer laser consist of monochromatic light. Therefore, if an excimer laser beam having a wavelength suitable for photoelectron emission is available, there is no problem in using excimer lasers. A KrF excimer laser or an ArF excimer laser is suitable for the excitation light to be irradiated on platinum.

Figure 8A:
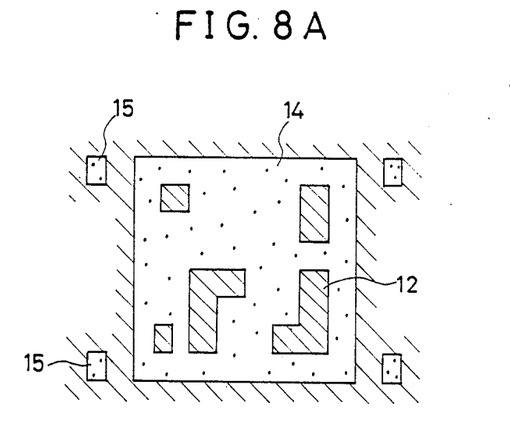
FIG. 8A is a plan view of an exposed area unit which may be included in the photoelectron mask of the present invention.
Figure 8B:
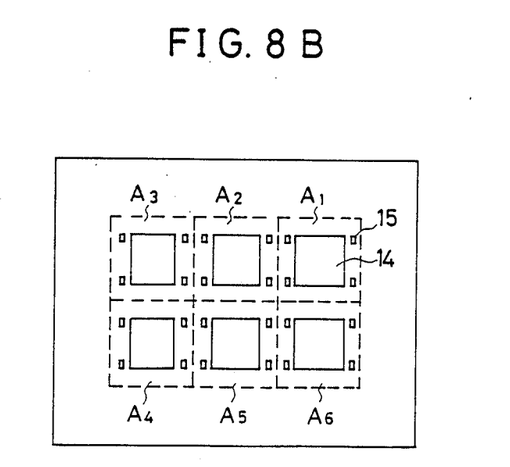
FIG. 8B is a plan view of the surface of the photoelectron mask of the present invention.

FIG. 8A schematically illustrates the exposed area unit which may be employed in the mask 10 of FIG. 3. FIG. 8B schematically illustrates the mask 10. The exposed area unit of FIG. 8A consists of the metallic pattern 12, a real exposure pattern 14 and alignment marks 15. The metallic pattern 12 functions to interrupt light emitted from the light sources 36. The metallic pattern 12 corresponds to a non-transparent area. A portion of the platinum film 13 formed directly on the surface of the transparent substrate 10 constructs the real exposure pattern 14 together with the metallic pattern 12. Four alignment marks 15 are provided in the vicinity of the respective corners of the real exposure pattern 14. As shown in FIG. 8B, the transparent substrate 11 includes six sets of exposed area units A1 through A6. Although the illustrated mask has six exposed area units A1 through A6, the present invention is not limited to the depicted mask. Masks having an arbitrary number of exposed area units can be used.

The positioning of the mask 10 and the wafer 40 is carried out as follows. During the positioning operation, light is irradiated only onto the alignment marks 15 of the exposed area unit of FIG. 8A. There is a distance of at most 60 $\mu$m between the center of each alignment mark 15 and the real exposure pattern 14. In a case where some light is irradiated onto the real exposure pattern 14, a portion of the real exposure pattern 14 may be partially exposed to the light. From the above viewpoint, it is necessary to focus the light beam for use in the positioning process so as to shape a spot. The secondary harmonic wave out of Ar laser beams can be used as the light for use in the positioning process. Main emission wavelengths of the Ar laser are equal to 514.5 nm and 488 nm. The secondary harmonic waves of these waves are ultraviolet light having wavelengths of 257.25 nm and 244 nm, respectively. The 5W-all-line Ar laser used in the experiment emits light having 2W at a wavelength of 514.5 nm. In the experiment, the conversion efficiency in converting 514.5 nm light to 257.25 nm light was approximately 0.1%, which amounts to 2 mW. The Ar laser can emit a light beam having a diameter of 0.5 mm. In the experiment, such light was converged to a diameter of 50 $\mu m\phi$. As a result of the convergence, the luminous intensity was 100 times as large as that of the original laser beam. The above value of the luminous intensity is enough to emit photoelectrons from the alignment marks 15. The positioning operation is described below.

Figure 9A:
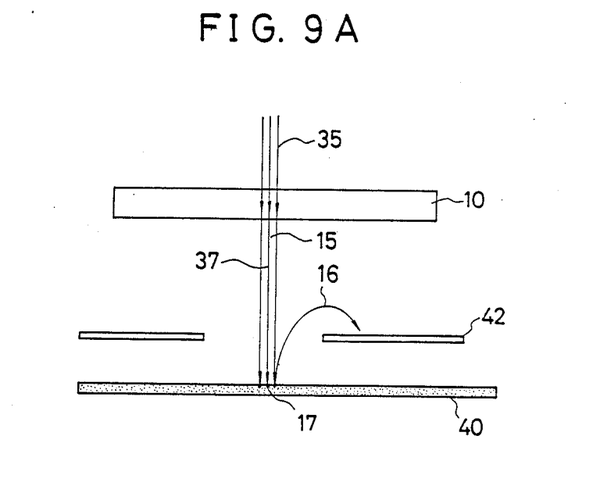
FIGS. 9A and 9B are diagrams for explaining the positioning process with respect to the mask and wafer.
Figure 9B:
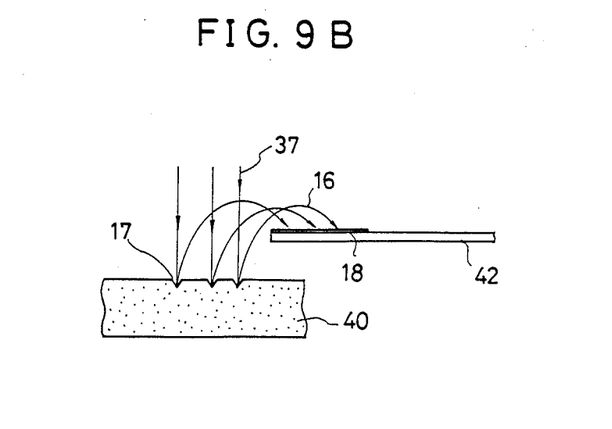

Referring to FIG. 9A, the ultraviolet beams 35 having a wavelength half that of the Ar laser beam are irradiated onto the alignment marks 15. In FIG. 9A, one of the alignment masks 15 shown in FIG. 2 is illustrated. Photoelectron beams 37 are emitted from the alignment mark 15 due to the irradiation of the ultraviolet beams 35. Then the photoelectron beams 35 hit a step mark 17 formed on the surface of the wafer 40. As shown in FIG. 9B, the step mark 17 includes a plurality of grooves formed on the surface of the wafer 40. The step mark 17 is located at a position corresponding to the alignment mark 15 of the mask 10. A potential proportional to the distance between the mask 10 and the wafer 40 is applied between the mask 10 and the wafer 40. Each plate electrode 42 has a backscattered electron detector 18. The photoelectron beams 37 emitted from the alignment mark 15 are backscattered onto the step mark 17. Then reflected photoelectron beams, or secondary electrons 16 reach the backscattered electron detector 18, as shown in FIG. 9B. The photoelectron beams 37 are deflected due to the function of the deflection coils 43 shown in FIGS. 1 and 2A. The deflection coils 43 are wound independently of the focusing coils 33. Thereby, change in the intensity of the secondary electrons 16 can be detected by the backscattered electron detector 18. As a result, the positioning between the alignment mark 15 and the step mark 17 can be performed based on a change in intensity. The step mark 17 can be substituted with a mark made of a heavy metal such as tantalum and tungsten.

In the experiment in which the wafer having the step mark 17 was used, an overlap accuracy of 0.1 μm was obtained with a positioning time of 30 msec and an accuracy of $3\sigma$. It can be concluded that the use of the laser beam having a wavelength half that of the Ar beam contributes to improving the positioning accuracy.

Conventionally, foreign materials which may adhere to the surface of the mask present serious problems in photo cathode image projection. As described previously, foreign materials, on the photo cathode film portion prevent photoelectrons from being emitted therefrom. This leads to defects in the pattern of the mask and therefore detects in the pattern transferred onto the wafer, and decreases the yield rate. Therefore, in a conventional photo cathode image projection apparatus, the vacuum chamber is kept in a high vacuum state to prevent the deposition of foreign materials on the mask. Further, the mask is sometimes heated in order to avoid the deposition of molecules of water and the like. Even if molecules of water are prevented from adhering to the mask, it is inevitable for atoms and molecules of resist to adhere to the mask during exposure. The above also decreased the photoelectron emission yield. Currently, the fine pattern technique is advanced, and a very fine and complex pattern is obtainable. Such a fine and complex pattern can be produced only by using a fine mask pattern. A long period of time is frequently taken to test the mask patterns determine whether they are in good condition.

The present invention overcomes the above-mentioned problems as follows. Registration exposure is carried out in which a mask having a plurality of identically exposed area units is used. The registration exposure carried out in the present invention is described with reference to FIGS. 8B and 10. A mask having exactly the same exposed area units A1 through A4 designed to be exactly the same as each other, is prepared. The registration exposure process commences to sequentially position the exposed area units A1 through A4 with respect to an area of the wafer on which the same patterns of the units are transferred. Then, the mask is exposed to light. A sequence of the positioning and exposing process is repetitively carried out four times. The exposure dose in each exposing process is set equal to a quarter of the predetermined exposure dose necessary to completely transfer the exposure pattern on the wafer.

Figure 10:
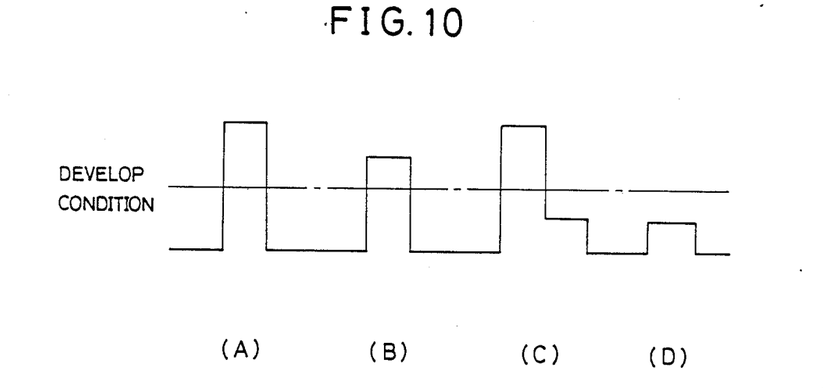
FIG. 10 is a view for explaining how to correct the pattern defect.

FIG. 10 is a graph of the results of each exposure obtained by the above-mentioned registration exposure process. FIG. 10-(A) is a graph of the results obtained in a case where there was no defect in the four exposed area units A1 through A4. FIG. 10-(B) is a result obtained in a case where a real exposure pattern is not present in one of the four exposed area units A1 through A4. In this case, the mask is exposed with an exposure dose amounting to three quarters of the aforementioned predetermined exposure dose. As a result, although the exposure dose is less than that for the case in FIG. 10-(A), a predetermined developing condition shown by the line in FIGS. 10-(A) through (D) is satisfied. FIG. 10-(C) is a result obtained in a case where an unnecessary pattern is contained in one of the four real exposure patterns. It can be seen from FIG. 10-(C) that, even if there is one unnecessary pattern, the corresponding projection image thereof is not formed on the mask. FIG. 10-(D) is a result obtained in a case where an unnecessary pattern in an area which is not designed to arrange a pattern therein is formed. As can be seen from FIG. 10-(D), the corresponding projection image does not appear. As a result of the aforementioned experimental results, a pattern defect is a serious problem only in a case where the pattern defect exists in the same portion in each of the four real exposure patterns.

The aforementioned registration exposure process itself is conventional. However it is noted that it is very difficult to realize the registration exposure process in conventional lithography processes. In other words, the registration exposure process is only realized by the present invention. The reasons are as follows. In a conventional exposure apparatus, a mask is mounted on a stationary X-Y stage. On the other hand, the mask on the X-Y stage 45 is movable. A movable range of the X-Y stage 45 may be selected in a range between the exposed area units A1 through A3. The X-Y stage 45 can be formed with a simple mechanism. Therefore, the X-Y stage 45 can be made light and is quickly movable. The exposure time with respect to one exposed area unit can be determined by a formula of (the aforementioned exposure time)/(the number of exposed area units). For example, if six exposed area units are used and the necessary exposure time is 3 minutes, an exposure time of 0.5 seconds is necessary to expose one exposed area unit. As described previously, the strong beam for use in the positioning process is obtainable. As a result, positioning between the mask 10 and the wafer 40 can be completed in 30 msec. Hence, even if it takes 100 msec to move the mask 10 to select the next exposed area unit, the suitable exposure dose is obtainable for an exposure time of at most one second per one shot, or in other words, less than 60 seconds per one sheet. The idea of the above-mentioned exposure process is conventionally proposed. However, it is noted that conventionally, a clear projection image on the wafer is not obtained unless a positioning accuracy of at least 0.1 μm with $3\sigma$ is available. On the other hand, according to the present invention, the above-mentioned positioning accuracy is obtainable. The reasons why the positioning accuracy equal to or greater than 0.1 μm with $3\sigma$ are as follows. First, the alignment marks 15 are made of pure silver, silver containing materials or silver compounds. Second, a strong beam having a wavelength half of an Ar beam wavelength is used as the light beam for use in the positioning process.

As described in the foregoing, the mask of the present invention can be activated. Originally, it is desired that atoms and molecules be prevented from adhering to the mask. A cleaning function is obtainable by irradiating light onto the mask while supplying the mask with an oxygen or hydrogen gas. The above can be achieved by applying a partial pressure of oxygen gas to the vacuum chamber. In our experiments, in a case when a partial pressure of oxygen gas is set equal to $1 \times 10^6$ torr with the vacuum chamber kept at a back pressure of $1 \times 10^{-7}$ torr, the time taken to clean up the mask was elongated by up to one and a half times.

Figure 11A:
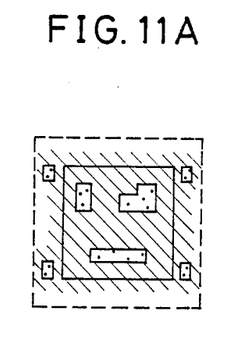
FIGS. 11A and 11B are diagrams for explaining reverse polarity patterns.
Figure 11B:
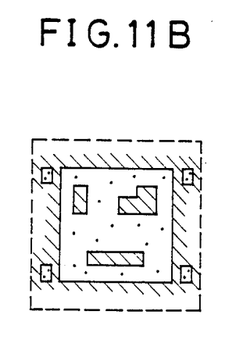
Figure 12:
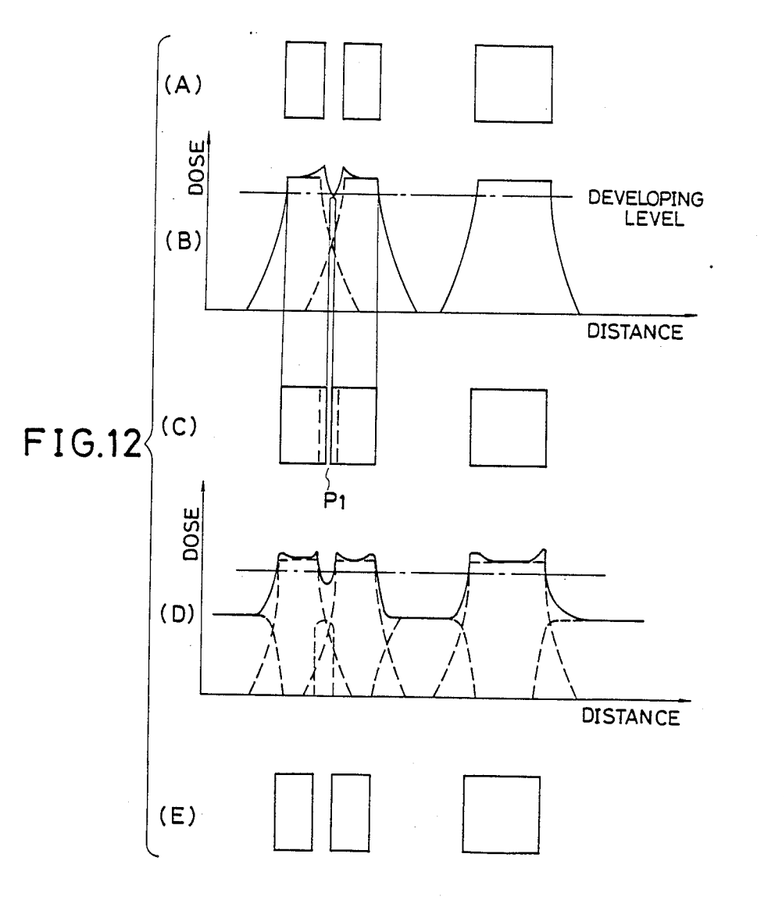
FIG. 12 is a diagram for explaining a method for correcting proximity effects.

A further description is given of a mask capable of coping with the proximity effect with reference to FIGS. 11A and 11B and FIG. 12. A mask has an exposed area unit A' in FIG. 11B and an exposed area unit A in FIG. 11A. The exposed area unit A in FIG. 11A has a pattern to be exposed. On the other hand, the exposed area unit A' in FIG. 11A has a reverse pattern in which a photoelectron emission portion and a non-transparent portion of the exposed area unit A of FIG. 11B are reversely formed.

In FIG. 12, which includes sections A-E, FIG. 12-(A) shows a pattern composed of three pattern segments provided in the exposed area unit A desired to be exposed. The exposure process commences to expose the exposed area unit A. FIG. 12-(B) is a graph of the relationship between the exposure dose and the position of the corresponding pattern transferred onto a wafer. In FIG. 12-(B), a pattern desired to be actually exposed is drawn by broken lines. It can be seen from FIG. 12-(B) that in a case where pattern segments to be exposed are close to each other, as shown in FIG. 12-(C), a portion P1 therebetween is processed due to the back-scattering of photoelectrons as if the portion P1 is actually exposed. After the exposure of the exposed area unit A, the reverse pattern A' of FIG. 11A is exposed with an exposure dose which is shown by a solid line in FIG. 12-(B) and which is less than that for the exposed area unit A in a state where the projection image of the exposed area unit A is somewhat out of focus. FIG. 12-(D) is a graph of the projection image after the reverse pattern A' is transferred onto the wafer. The exposure dose actually supplied to the mask is shown by a solid line in FIG. 12-(D). A pattern as shown in FIG. 12-(E) can be obtained by selecting an optimum developing condition in which the exposure dose is less than that for FIG. 12-(B).

The proximity effect can be compensated as follows. A pattern desired to be exposed is formed in the exposed area unit A. In order to compensate the proximity effect, only a pattern which consists of segments to which a large exposure dose should be supplied, is formed in an exposed area unit A''. After exposing the exposed area unit A, the exposure area unit A'' is exposed with a suitable exposure dose.

Figure 13A:
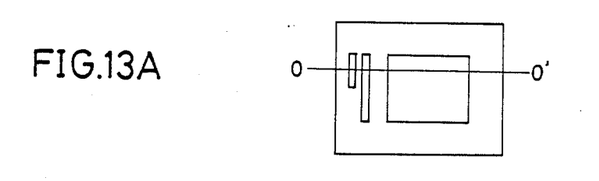
FIGS 13A through 13D are diagrams for explaining another method according to the present invention for correcting proximity effects.
Figure 13B:
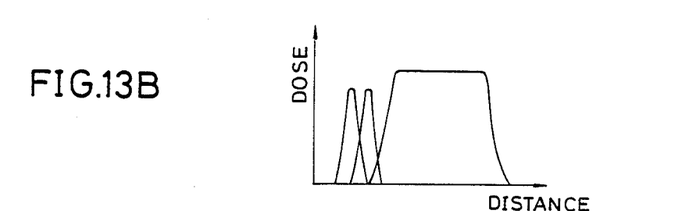
Figure 13C:
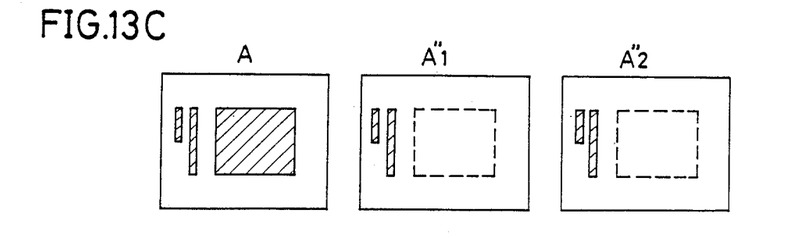
Figure 13D:
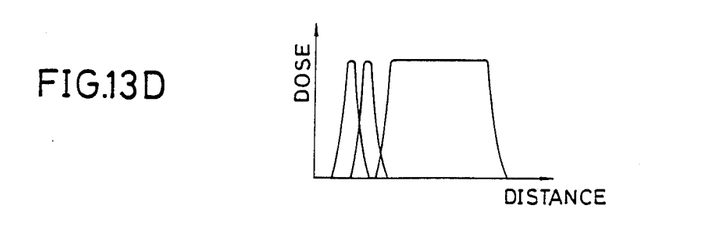

As shown in FIGS. 13A and 13B, a projection image of a relatively large pattern segment can be formed on the wafer with a small exposure dose, because backscattered electrons from the large pattern segment interface each other. As a result, in a case where a relatively small pattern segment is exposed with an exposure dose identical to that for the large exposure dose, the small pattern does not appear. From this viewpoint, as shown in FIG. 13C, the entire pattern to be exposed is formed in the exposed area unit A. On the other hand, in each of the exposed area units A'' ($A_1''$ and $A_2''$), only segments of the entire pattern to which a large exposure dose should be supplied are formed. The exposed area units $A_1''$ and $A_2''$ are exposed with a suitable exposure dose after the exposed area unit A is exposed. When it is assumed that the exposure dose for the exposed area unit A is represented as "1", it is preferable to select the exposure dose for the exposed area unit A'' approximately one to five times as large as the exposure dose for the exposed area unit A.

It is noted that it is not necessary for the entire pattern to be formed in the exposed area unit A, because a pattern on the wafer is formed with a plurality of exposed area units. For example, pattern segments are separately formed in the plurality of exposed area units.

The present invention is not limited to the aforementioned embodiments, and variations and modifications may be made without departing from the scope of the present invention.

What is claimed is:

1. A photoelectron mask for photo cathode image projection, comprising:
    a transparent substrate;
    a pattern formed on a main surface of said transparent substrate, said pattern including a non-transparent material; and
    a photo cathode film formed covering the main surface of said transparent substrate on which said pattern is formed and having a thickness between 10 to 300Å, said photo cathode film including a material selected from the group consisting of pure platinum, a platinum-rich material containing platinum as the major component, and a platinum compound.

2. A photoelectron mask as claimed in claim 1, wherein said platinum-rich material is a material selected from the group consisting of silicon, tungsten, nitrogen, titanium, chromium, aluminum, palladium, gold, silver, copper, oxygen, rhodium, and iridium.

3. A photoelectron mask as claimed in claim 2, wherein said platinum-rich material contains platinum having 85 weight % or more.

4. A photoelectron mask as claimed in claim 1, wherein said platinum compound is a material selected from the group consisting of platinum chloride, platinum fluoride, platinum oxide, platinum selenium and barium platinum.

5. A photoelectron mask as claimed in claim 1, wherein said pattern formed on the main surface of said transparent substrate is divided into a plurality of units, and an area on the main surface which includes one of the units is exposed one time.

6. A photoelectron mask as claimed in claim 5, further comprising alignment masks arranged in the vicinity of each of the units, each of said alignment marks comprising a material selected from the group consisting of pure platinum, a platinum-rich material containing platinum as the major component, and a platinum compound.

7. A photoelectron mask as claimed in claim 5, said pattern comprises pattern segments, some segments being separately provided in said plurality of units.

8. A photoelectron mask as claimed in claim 5, wherein the same pattern is provided in each of said units.

9. A photoelectron mask as claimed in claim 5, wherein said pattern formed in one of said units is formed in accordance with a positive pattern image thereon, and said pattern formed in another one of said units is formed in accordance with a negative pattern image thereof.

10. A photoelectron mask as claimed in claim 1, wherein said non-transparent material is selected from the group consisting of chromium, tantalum and tungsten.

11. A photoelectron mask as claimed in claim 1, wherein said non-transparent film is approximately 400 to 2000 Å thick.

12. A photo cathode image projection method comprising the steps of:
    (a) projecting an excitation light onto a photoelectron mask placed in a vacuum chamber to thereby excite photoelectrons, the photoelectron mask having a photo cathode film having a thickness between 10–300Å and including a photo cathode material selected from the group consisting of pure platinum, a platinium-rich material containing platinum as the major component, and a platinum compound; and
    (b) projecting photoelectrons from the photoelectron mask onto a wafer placed in the vacuum chamber by focusing the photoelectrons emitted from the photo cathode material due to a function of a magnetic field and an electric field, so that a pattern is formed on the wafer by the projection of the photoelectrons.

13. A photoelectron cathode image projection method as claimed in claim 12, wherein said step (a) projects the excitation light having a wavelength approximately between 220 to 300 nm.

14. A photo cathode image projection method as claimed in claim 12, further comprising step (c) of projecting light onto the photoelectron mask in a state where a gas selected from the group consisting of a nitrogen gas, an oxygen gas, an ozone gas and a mixture gas consisting of an arbitrary combination thereof, is supplied to the vacuum chamber, and wherein said step (a) of projecting light onto the photoelectron mask is carried out after the mask is exposed with a predetermined exposure dose or after a predetermined time from the beginning of exposure, whereby the mask is cleaned up.

15. A photo cathode image projection method as claimed in claim 12, wherein said step (b) of projecting photoelectrons onto the wafer is carried out in a state where one of a partial pressure of a nitrogen gas, an oxygen gas and an ozone gas is applied to the vacuum chamber during the projection of photoelectrons.

* * * * *

UNITED STATES PATENT AND TRADEMARK OFFICE
CERTIFICATE OF CORRECTION

PATENT NO. : 4,954,717

DATED : SEPTEMBER 4, 1990

INVENTOR(S) : KIICHI SAKAMOTO ET AL.

It is certified that error appears in the above-identified patent and that said Letters Patent is hereby corrected as shown below:

Col. 1, line 62, after "gap" insert --between the mask and the wafer varies due to the--.

Col. 6, line 21, "in" should be --is--;

line 42, "θA/" should be --uA/--;

line 47, "6"" should be --6"$\phi$--.

Signed and Sealed this

Twenty-fourth Day of December, 1991

Attest:

HARRY F. MANBECK, JR.

*Attesting Officer*  *Commissioner of Patents and Trademarks*